US009747035B2

(12) United States Patent
Kumar et al.

(10) Patent No.: US 9,747,035 B2
(45) Date of Patent: Aug. 29, 2017

(54) REDUCING MEMORY OVERHEAD ASSOCIATED WITH MEMORY PROTECTED BY A FAULT PROTECTION SCHEME

(71) Applicant: Empire Technology Development LLC, Wilmington, DE (US)

(72) Inventors: Rakesh Kumar, Champaign, IL (US); Xun Jian, Champaign, IL (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 137 days.

(21) Appl. No.: 14/573,259

(22) Filed: Dec. 17, 2014

(65) Prior Publication Data

US 2016/0179370 A1    Jun. 23, 2016

(51) Int. Cl.
G11C 29/00 (2006.01)
G06F 3/06 (2006.01)
(Continued)

(52) U.S. Cl.
CPC ............ G06F 3/061 (2013.01); G06F 3/0619 (2013.01); G06F 3/0659 (2013.01);
(Continued)

(58) Field of Classification Search
CPC ............ G06F 11/1076; G06F 11/1008; G06F 3/0689; G06F 2211/1004; G11B 20/1833
(Continued)

(56) References Cited

U.S. PATENT DOCUMENTS 5,392,244 A * 2/1995 Jacobson ............ G06F 11/1076
711/114
5,664,187 A * 9/1997 Burkes ................... G06F 3/0601
707/999.2
(Continued)

FOREIGN PATENT DOCUMENTS

WO    2009000639 A2    12/2008

OTHER PUBLICATIONS

"Disk mirroring," Wikipedia, accessed at https://web.archive.org/web/20140810153517/http://en.wikipedia.org/wiki/Disk_mirroring, Last modified on Jul. 15, 2014, pp. 1-4.
(Continued)

Primary Examiner — Albert Decady
Assistant Examiner — Osman M Alshack
(74) Attorney, Agent, or Firm — Turk IP Law, LLC

(57) ABSTRACT

A memory request initiates access to a memory location in the memory. The memory location is evaluated to determine whether the memory location is located within a first portion of the memory or within a second portion of the memory. In response to determining that the memory location is located within the first portion and that the memory request is a read request, the memory location located within the first portion is accessed. In response to determining that the memory request is a write request and the memory location is located within the first portion, the memory location located within the first portion and a duplicate of the memory location is accessed. When the memory location is located within the second portion, the memory location located within the second portion using a redundant array of independent disks (RAID) memory mechanism, in response to the memory request being the write request.

20 Claims, 5 Drawing Sheets

(51) Int. Cl.
*G06F 11/10* (2006.01)
*G06F 11/14* (2006.01)
*G11C 7/10* (2006.01)
*G06F 11/16* (2006.01)

(52) U.S. Cl.
CPC ........ *G06F 3/0689* (2013.01); *G06F 11/1076* (2013.01); *G06F 11/14* (2013.01); *G06F 11/141* (2013.01); *G06F 11/1666* (2013.01); *G11C 7/1006* (2013.01)

(58) Field of Classification Search
USPC .......................................... 714/763, 769, 770
See application file for complete search history.

(56) References Cited

U.S. PATENT DOCUMENTS

| | | | | |
|---|---|---|---|---|
| 6,748,488 | B2* | 6/2004 | Byrd ................... | G06F 11/1076 711/114 |
| 7,908,448 | B1* | 3/2011 | Chatterjee ........... | G06F 11/2064 707/655 |
| 8,024,643 | B2* | 9/2011 | Pashenkov ......... | G11B 20/1833 714/704 |
| 8,046,548 | B1* | 10/2011 | Chatterjee ........... | G06F 11/2064 707/655 |
| 2003/0033572 | A1* | 2/2003 | Walton ................ | G06F 11/108 714/763 |
| 2007/0088900 | A1* | 4/2007 | Moritoki ............. | G06F 3/061 711/4 |
| 2008/0140961 | A1* | 6/2008 | Atherton ............. | G06F 11/1666 711/162 |
| 2008/0186318 | A1* | 8/2008 | Redshaw .............. | G06T 15/005 345/537 |
| 2011/0258393 | A1* | 10/2011 | Flower ................ | G06F 12/0866 711/120 |
| 2013/0117606 | A1* | 5/2013 | Anholt ................ | G06F 11/1048 714/15 |
| 2013/0179634 | A1* | 7/2013 | Munireddy ......... | G06F 11/2058 711/114 |
| 2016/0162422 | A1* | 6/2016 | Weber ................. | G06F 13/28 710/308 |

OTHER PUBLICATIONS

"Standard RAID levels," Wikipedia, accessed at https://web.archive.org/web/20140723175850/https://en.wikipedia.org/wiki/Standard_RAID_levels, Last modified on Jul. 18, 2014, pp. 1-7.

Bathen, L. A. D., and Dutt, N. D., "E-RoC: Embedded RAIDs-on-Chip for low power distributed dynamically managed reliable memories," Design, Automation & Test in Europe Conference & Exhibition, pp. 1-6 (2011).

Hwang, A. A., "Cosmic Rays Don't Strike Twice: Understanding the Nature of Dram Errors and the Implications for System Design," SIGARCH Computer Architecture News, vol. 40, No. 1, pp. 111-122 (2012).

Moon, S., and Reddy, A. L. N., "Don't Let RAID Raid the Lifetime of Your SSD Array," Proceedings of the 5th USENIX conference on Hot Topics in Storage and File Systems, pp. 1-5 (2003).

Schroeder, B., et al., "DRAM errors in the wild: a large-scale field study," ACM SIGMETRICS Performance Evaluation Review—SIGMETRICS, vol. 37, Issue 1, pp. 193-204 (2009).

Sridharan, V., and Liberty, D., "A Field Study of DRAM Errors," accessed at http://softerrors.info/selse/images/selse_2012/Papers/selse2012_submission_4.pdf, accessed on Aug. 25, 2014, pp. 1-6.

Sridharan, V., and Liberty, D., "A Study of DRAM Failures in the Field," Proceedings of the International Conference on High Performance Computing, Networking, Storage and Analysis, Article No. 76, pp. 1-11 (2012).

Zhang, W., et al., "ICR: In-Cache Replication for Enhancing Data Cache Reliability," International Conference on Dependable Systems and Networks, pp. 291-300 (2003).

Lee, B. C. et al., "Architecting Phase Change Memory as a Scalable DRAM Alternative," Proceedings of the 36th annual international symposium on Computer architecture, pp. 2-13 (Jun. 20, 2009).

* cited by examiner

REDUCING MEMORY OVERHEAD ASSOCIATED WITH MEMORY PROTECTED BY A FAULT PROTECTION SCHEME

BACKGROUND

Unless otherwise indicated herein, the materials described in this section are not prior art to the claims of this application and are not admitted to be prior art by inclusion in this section.

Memory may be a source of failure in a computer system. In order to help address potential memory failures, different fault-protection mechanisms have been developed to assist in recovering more quickly in the event of a memory failure. One mechanism that might be used to protect against failure of persistent storage devices, such as hard disks, is the use of a redundant array of independent disks (RAID) mechanism. Generally, RAID may distribute data across different storage devices according to the RAID scheme utilized (e.g., RAID 0, RAID 1, RAID 2, RAID 3, RAID 4, RAID 5, RAID 6). Distributing the data across the different storage devices using the RAID mechanism may use multiple memory accesses for each write.

Another mechanism that may be used to protect against device failures is a memory duplication-based mechanism. For example, each write to a memory may include a first write of data to the memory and a second write to another memory to produce a copy of the data. As such, a duplication-based mechanism may lead to using twice as much memory as compared to not duplicating the memory. Each of these different fault-protection mechanisms can have different strengths and weaknesses. In some cases, it can be challenging to select the fault-protection mechanism to use.

SUMMARY

In one example, a method to reduce write overhead to a memory in a fault protection scheme is described. A memory request may be received that initiates access to a memory location in the memory. The memory may include a first portion that is duplicated to provide a duplicated first portion and a second portion that is not duplicated. The memory location may be evaluated to determine whether the memory location is located within the first portion or within the second portion. In response to determining that the memory location is located within the first portion, the memory location located within the first portion may be accessed. The memory location located within the first portion may be accessed, in response to the memory request being a read request. In response to the memory request being a write request, the memory location located within the first portion may be accessed, and a duplicate of the memory location that is located within the duplicated first portion may be accessed.

In response to determining that the memory location is located within the second portion, the memory location located within the second portion may be accessed. The memory location located within the second portion may be accessed in response to the memory request being a read request. In response to the memory request being the write request, the memory location located within the second portion may be accessed using a redundant array of independent disks (RAID) memory mechanism.

In a further example, an apparatus is described. The apparatus may include one or more memories and a controller. The memory may include a first portion and a second portion. The first portion of the one or more memories may be duplicated to provide a duplicated first portion. A controller, coupled to the one or more memories, may be configured to receive a memory request that requests access to a memory location in the one or more memories. The controller may determine that the memory location is located within the first portion. In response to the determination that the memory location is within the first portion, the controller may read from at least one of the memory location or a duplicate memory location in the duplicated first portion of the memory in response to the memory request being a read request. The controller may write to the memory location in the first portion and write to the duplicate memory location that is located within the first duplicated portion in response to the memory request being a write request.

In response to the memory location not being located within the first portion, the controller may determine that the memory location is within the second portion and read from the memory location in the second portion in response to the memory request being the read request. The controller may write to the memory location in the second portion in response to the memory request being the write request.

In another example, a computer-readable storage medium is described. The computer-readable storage medium comprises computer-executable instructions stored thereon which, in response to execution by a computer, cause the computer to determine whether a memory request is a write request to write to at least one of a first portion of one or more memories that is protected by a duplicate memory mechanism or a second portion of one or more memories that is protected by a second memory mechanism. In response to the write request that requests to write to the first portion, data may be written to the first portion of the one or more memories and written to another memory based at least in part on the duplicate memory mechanism. In response to the write request being a request to write to the second portion, the write may be performed to the second portion using the second memory mechanism.

The foregoing Summary is illustrative only and is not intended to be in any way limiting. In addition to the illustrative aspects, embodiments, and features described above, further aspects, embodiments, and features will become apparent by reference to the Figures and the following Detailed Description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
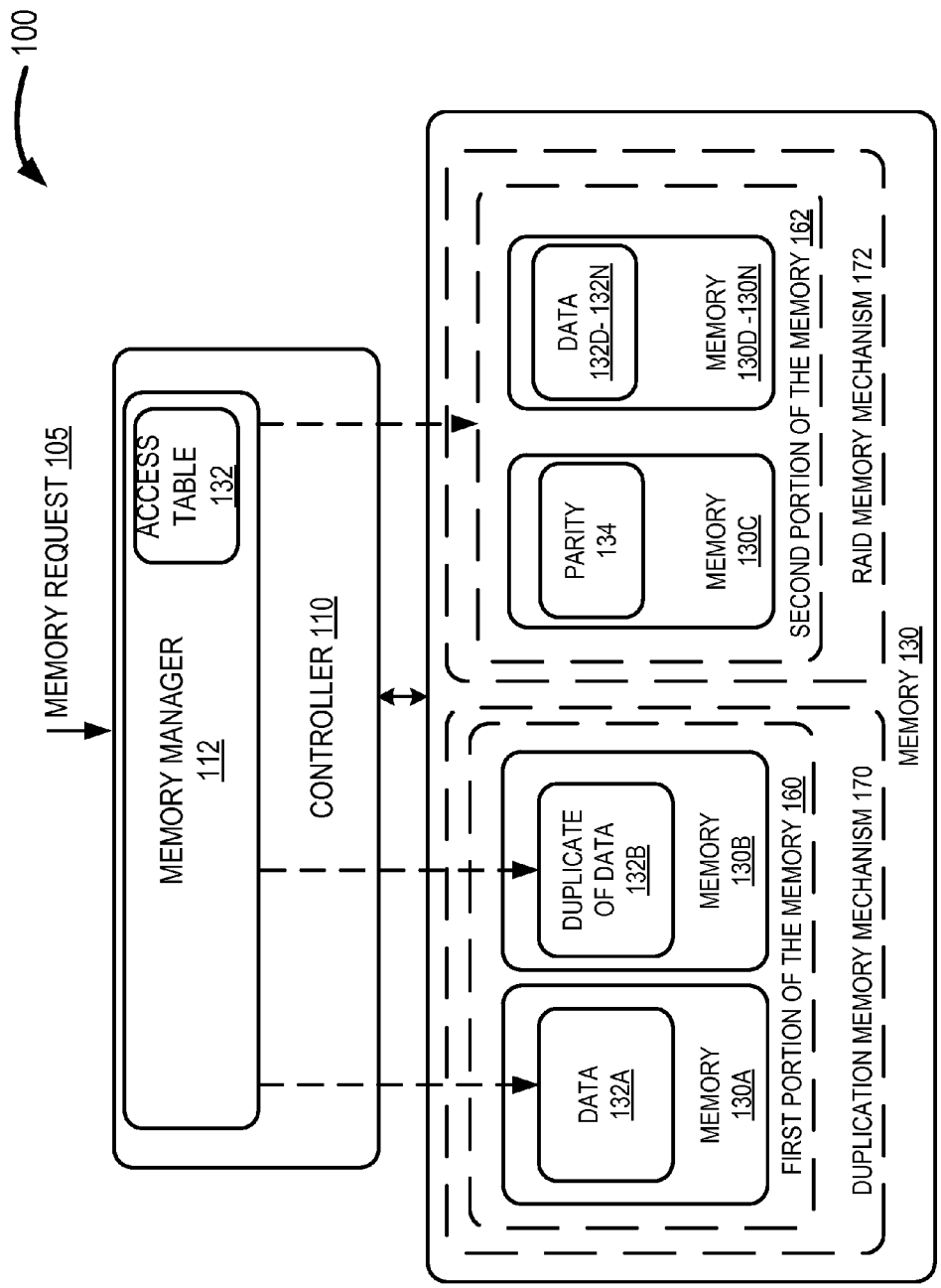
FIG. 1 is a block diagram of a memory system configured to reduce memory overhead in a device-level fault-protection memory mechanism.

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein.

The aspects of the present disclosure, as generally described herein, and illustrated in the figures, can be arranged, substituted, combined, separated, and designed in a wide variety of different configurations, all of which are explicitly contemplated herein. Further, one or more components of various figures described below may not be included in the figure for purposes of clarity. This should not be construed as a disclaimer or admission that the non-included components do not form part of the subject matter described herein. Additionally, one or more figures may use a "dashed" line as a border to visually encapsulate one or more components. Unless specifically described otherwise, the use of a dashed line is for purposes of illustration and does not reflect functional or physical boundaries.

This disclosure is drawn, inter alia, to technologies used to reduce memory overhead associated with accessing memory that is protected by a fault-protection mechanism. According to some examples, a number of write accesses to the memory may be reduced and/or an amount of memory used in the fault protection mechanism may be reduced as compared to some other fault-protection mechanisms.

As the memory capacity of computing devices increases, memory reliability may become an increasing concern. With these increasingly large memory systems, memory errors, such as detectable uncorrectable errors ("DUEs") and silent data corruption ("SDCs) errors may be a cause of memory errors. For the memory that is not protected by a fault-protection mechanism, these memory errors may cause downtime for a computing device (e.g., a DUE may often cause a system crash). These memory errors might also result in unrecoverable failures (e.g., failures due to SDCs) which may be even more costly.

In some configurations, memory associated with a computing device may use a duplication memory mechanism and a RAID memory mechanism as part of a fault-protection mechanism to protect the memory. The memory that is protected using the different mechanisms might include system memory associated with a computing device or other types of memory (e.g., memory used for persistent storage). According to some examples, a first portion of the memory may be protected using the duplication memory mechanism and a second portion of the memory may be protected using a RAID memory protection mechanism. Different RAID schemes, such as RAID 0, RAID 1, RAID 2, RAID 3, RAID 4, RAID 5 or RAID 6 might be utilized. According to some configurations, the RAID memory mechanism may use a scheme that may employ an error protection scheme called "parity." Parity is an example of a mechanism that may be used to provide fault tolerance in a given set of data. In some cases, the RAID scheme used to protect the second portion of the memory may be changed from one scheme to another scheme.

According to some configurations, the first portion of the memory may be sized and identified based at least, in part, on the memory locations within the memory that are receiving the most writes (e.g., are subject to a relatively higher amount of write operations). For instance, a counter might be used to maintain one or more counts that may be utilized to determine the memory pages in the memory that are receiving the most writes.

In some configurations, the size of the first portion may be set to some percentage of the total size of the memory (e.g., less than 20%) that may be experiencing the most writes. The second portion of the memory may be all or a portion of the remaining memory that is not associated with the first portion of the memory. Generally, the second portion of the memory may not be written to as frequently as the first portion of the memory. In some examples, the size and/or location of the memory that is associated with the first portion of the memory and the memory that is associated with the second portion of the memory may be dynamically adjusted. For example, the memory that is associated with the first portion and the second portion might be changed.

The first portion of the memory may or may not be contiguous memory locations. For example, the first portion of the memory may include memory pages that are spread throughout the memory and the second portion of the memory may include memory pages that are interspersed with the memory pages that are associated with the first portion.

In some configurations, the memory may be segmented into chunks of memory pages. As an example, if the chunk size is sixteen memory pages, then the first portion of the memory might include two memory pages and the second portion of the memory might include fourteen memory pages. The first portion may include a first memory page that contains data requested to be stored and the second page may include a copy of the data requested to be stored (e.g., one page has a duplicate page). The second portion of the memory might include thirteen data pages that may be protected using one parity page (e.g., a fourteen page RAID group). Other sizes for the different portions might be selected. Since most of the writes may be to memory pages that are associated with the first portion and have duplicates, the average number of additional memory accesses per write in the fault-protection mechanism described herein may be one (e.g., the write of the data to the duplicate page), instead of three or more memory accesses that might be used if a RAID memory mechanism protected the entire memory. Similarly, the storage overhead for the fault-protection mechanism to protect the memory may be less since the entire memory is not duplicated (e.g., less than 20% as compared to up to 100% used for duplicating the entire memory).

During operation, a memory request (e.g., a read or write request) may be received that requests access to the memory. The memory request may request access to a memory location that is associated with the first portion of the memory or request access to a location within the second portion of the memory. When the memory request is associated with a location in the first portion of the memory, the duplication mechanism may be utilized for protecting the first portion of the memory. In some examples, an access table may be used when determining whether the memory location is located within the first portion of the second portion.

When the memory request is a write request to a location in the first portion, then the write may be performed according to the duplication memory mechanism. For example, a write of data may be performed at the memory location in the first portion of the memory and a write may also be performed at another location within another memory, or possibly the same memory, to create a duplicate of the data.

When the memory request is associated with a location in the second portion of the memory, the RAID memory mechanism may be utilized. For example, when a write request is received for a memory location that is within the second portion, the RAID memory mechanism may be used to write the data (e.g., read old data and parity, compute new parity, and write data and new parity). More details regarding reducing memory overhead using a fault-protection mechanism are provided below.

FIG. 1 is a block diagram of a memory system 100 configured to reduce memory overhead in a device-level fault-protection memory mechanism, in accordance with at least some embodiments. As illustrated, the memory system 100 may include a controller 110 and a memory 130 that may include memory 130A-130N. The controller 110 may include a memory manager 112 that may include an access table 132.

Figure 5:
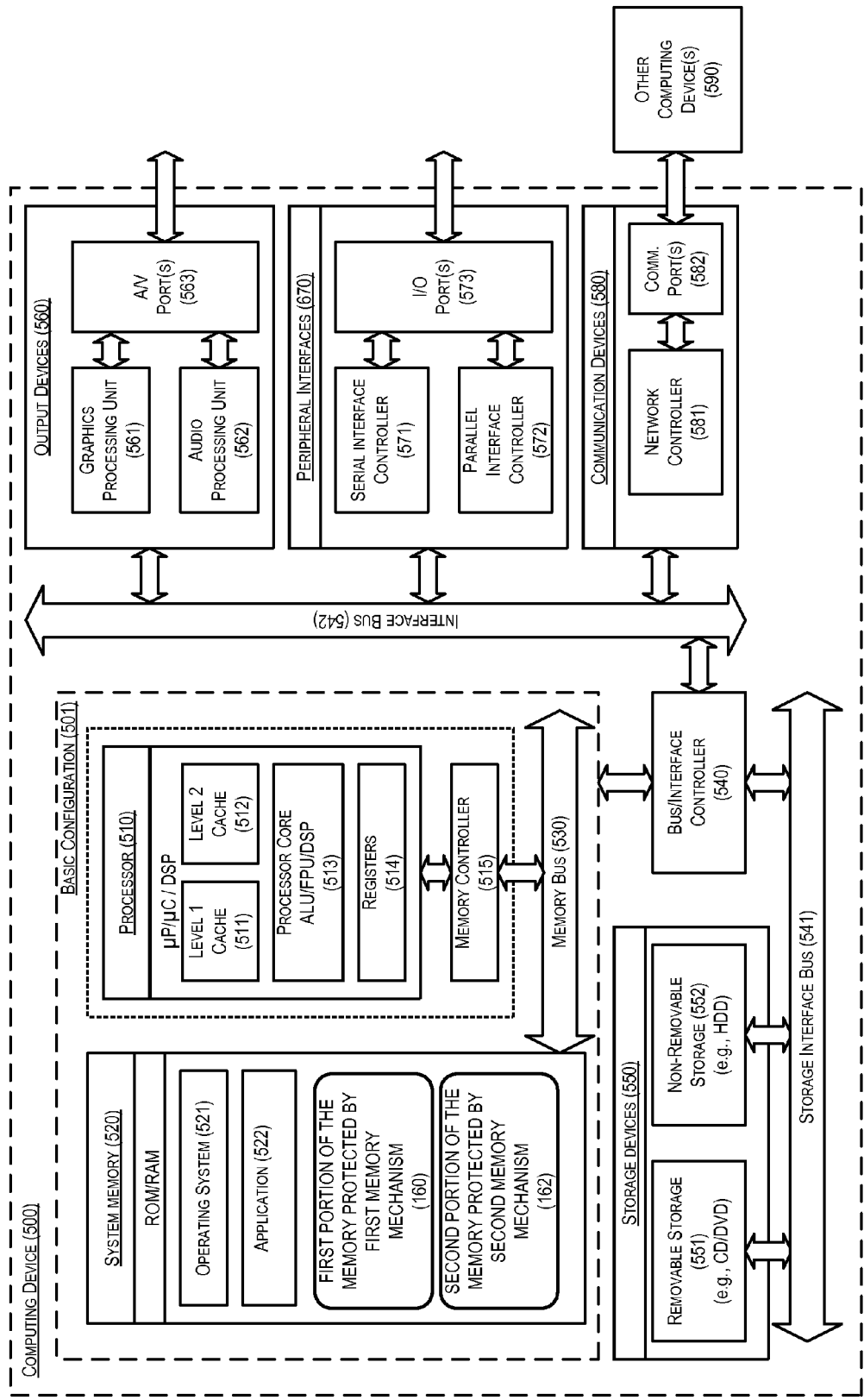
FIG. 5 is a block diagram illustrating an example computing device that is arranged to implement technologies to reduce the overhead of memory accesses to memory protected by a fault-protection mechanism, all arranged according to at least some embodiments presented herein.

The components of the memory system 100 may be part of one or more components of a computing device or system. The composition, use and location of the components of memory system 100 may vary from application to application. For example, the memory 130 may be stored within or comprise part of the system memory 520 of a computing device 500 as illustrated in FIG. 5. As illustrated, the controller 110 may be coupled to the memory 130. In some examples, a memory bus, such as the memory bus 530 shown in FIG. 5, may couple the memory 130 and the controller 110.

The memory 130 may include one or more memories, such as the memory 130A-130N. For example, the one or more memories might include volatile and/or non-volatile memories. In some examples, the memory 130 may include a plurality of memories such that if one memory fails, other memories may remain operational. Many different types of memory may be used within the memory system 100. In some examples, the memory 130 might be embodied as dynamic random-access memory ("DRAM"), double data rate synchronous dynamic random-access memory ("DDR SDRAM"), static random-access memory ("SRAM"), magnetoresistive random-access memory ("MRAM"), or some other type of volatile or non-volatile memory might be used. According to some examples, the memory 130 may have a higher latency and energy overhead as compared to DRAM. In some configurations, the memory 130 may be implemented as the system memory for one or more computing devices. For example, the memory 130 may be utilized in a server computing device.

The controller 110 may include one or more controllers. In some configurations, the controller 110 may be embodied as an embedded processor or as some other type of processor. The controller 110 might include more or fewer components as illustrated. In the current example, the controller 110 may include a memory manager 112. The memory manager 112 may be configured to perform functionality/operations relating to using different memory mechanisms to protect the memory 130. In some configurations, the memory manager 112 may protect the first portion of the memory 160 using a first memory mechanism and may protect the second portion of the memory 162 using a different memory mechanism. The different memory mechanisms may be directed at protecting against a full or partial failure of at least a portion of the memory 130.

According to some configurations, the first portion of the memory 160 may be protected using a duplication memory mechanism 170 and the second portion of the memory 162 may be protected using a RAID memory mechanism 172. When using the duplication memory mechanism 170, the memory manager 112 may use a first memory, such as the memory 130A to hold data 132A, and a second memory, such as the memory 130B to hold a duplicate of the data 132B.

When using the RAID memory mechanism 172, the memory manager 112 may use a portion of the memory, such as memory 130C, to hold parity 134, and another portion of the memory, such as the memory 130D-130N to store the data (shown generally as data 132N in FIG. 1). According to some configurations, the memory 130 may be segmented into memory pages. A "memory page" or a "page" may refer to a fixed length contiguous block of the memory 130. For example, a size of a page may be 4 KB, 8 KB, 16 KB, 32 KB, 64 KB, 128 KB, 1024 KB, 2 MB, 4 MB, 16 MB, 1 GB, or other sizes. In other examples, the memory may be divided into different segments (e.g., lines).

When using the RAID memory mechanism 172, the memory manager 112 may use a portion of the memory pages associated with the second portion of the memory 162 to hold parity and another portion of the memory pages to store the data. Depending on the RAID memory mechanism selected, the amount of memory 130 that acts as the parity memory and the data memory may differ for different RAID groups.

While RAID may be effective at providing reliability against full device failures, the use of a RAID memory mechanism to protect a portion of the memory 130 may involve additional memory accesses for write operations to the memory 130 protected using the RAID memory mechanism 172. For example, when the memory manager 112 uses the RAID memory mechanism 172 for protecting the second portion of the memory 162, there may be three additional memory accesses for the memory request 105 that is a write request to a location within the second portion of the memory 162. The three additional memory accesses might include a first read memory access to read data, a second read memory access to read parity, and a third write memory access to write the new parity.

The duplication memory mechanism 170 may use one additional memory access for a memory request 105 that is a write request to a first location that is within the first portion of the memory 160. For example, a write of data 132A to the memory 130A may also result in a write of the data to the memory 130B thereby creating a duplicate of the data 132B. When the memory request 105 is a read request of a memory location within the first portion of the memory 160, then the controller 110, or the memory manager 112, may read from either the location in the memory 130A or read from a duplicate memory location in the memory 130B.

As discussed in more detail below with regard to FIG. 2, the memory manager 112, the controller 110, or some other component may determine the memory locations of the memory 130 that are frequently accessed. For example, the memory manager 112 may determine the memory pages of the memory 130 that receive the most (or otherwise relatively more) write requests. Different mechanisms might be used to determine memory locations that are more frequently accessed as compared to other memory locations. For example, a count of accesses to memory locations might be maintained, the most recently used memory locations might be determined, the least recently used memory locations might be determined, and the like. In some cases, a small fraction (e.g., 20% or some other value) of the pages in the memory may be found to satisfy the majority of the write accesses to the memory 130.

In some examples, the memory manager 112 may segment the memory 130 into at least two different portions, such as the first portion of the memory 160 and the second portion of the memory 162. The first portion of the memory 160 that is associated with memory pages within the memory 130 that receive frequent write accesses may use the duplication memory mechanism 170. In some examples, the memory manager 112 may store the memory locations that are within the first portion of the memory 160 within the access table 132. The memory manager 112 might also store the memory locations that are within the second portion of the memory 160 within the access table 132. The second portion of the memory 160 that is associated with memory pages within the memory 130 that may be determined to not receive frequent write accesses may use the RAID memory mechanism 172. In other examples, the memory manager 112 might segment the memory 130 into more than two portions (e.g., 3, 4, 5). Some or all of these portions may be protected by different memory mechanisms (e.g., the second portion protected by RAID 4 and the third portion protected by RAID 5).

The memory 130 that is associated with the first portion of the memory 160 and the memory 130 that is associated with the second portion of the memory 162 may not be contiguous memory locations. For example, a page of memory that is within the first portion of the memory 160 may be followed by a page of memory designated to be in the second portion of the memory 162 that is followed by a page or memory designated to be in the first portion of the memory 160.

During operation, the controller 110 may receive the memory request 105 that requests access to the memory 130. The memory request 105 may request access (e.g., read or write access) to one or more memory locations within the memory 130. In some configurations, the memory manager 112 may determine whether the memory location that is associated with the memory request 105 is located within the first portion of the memory 160 or is located within the second portion of the memory 162.

In some configurations, the memory manager 112 may use the access table 132 to identify whether the memory request 105 is for a memory location that is located within the first portion of the memory 160 or is located within the second portion of the memory 162. The access table 132 may be stored in a volatile or non-volatile memory. For example, FIG. 2 illustrates the access table 132 stored in a cache 210. As discussed above, the access table 132 might be generated by the memory manager 112 based on how the memory 130 is segmented into the first portion of the memory 160 and the second portion of the memory 162. When the memory request 105 is received, the memory manager 112 may use the memory location identified by the memory request 105 to identify the associated memory portion (e.g., the first or second portion) using a mapping that may be contained within the access table 132. For example, the access table 132 might include a list of each memory page and/or location that is within the first portion of the memory 160 and/or a list of each memory page and/or location that is within the second portion of the memory 162.

In response to determining that the location of the memory request 105 is within the first portion of the memory 130, the controller 110 or the memory manager 112 may perform/apply the memory request 105 in the first portion utilizing the duplicate memory mechanism 170. For example, when the memory request 105 is a write request to a location within the memory 130A, then the controller 110 may perform a write of the data 132A at the memory location in the memory 130A. The data 132A may also be written to a duplicate memory location within the memory 130B that creates the duplicate of data 132B. When the memory request 105 is a read request to a location within the memory 130A, then the controller 110 may read the data 132A at the memory location in the memory 130A. Alternatively, the memory manager 112 may read the data 132A from the memory 130B by accessing the duplicate of data 132B that is a copy of the data 132A.

In response to determining that the location of the memory request 105 is within the second portion of the memory 130, the controller 110 or the memory manager 112 may perform/apply the memory request 105 utilizing the RAID memory mechanism 172. When the memory request 105 is a write request to a location within the second portion of the memory 162, the memory manager 112 may perform additional memory accesses depending on the RAID scheme being utilized. As examples, one memory access to read the data, another memory access to read the parity, another memory access to write the data, and yet another memory access to write a new parity. The new parity may be computed by the memory manager 112, or some other component. More details regarding utilizing a duplication memory mechanism and a RAID memory mechanism for protecting the memory 130 against device-level faults are provided below.

Figure 2:
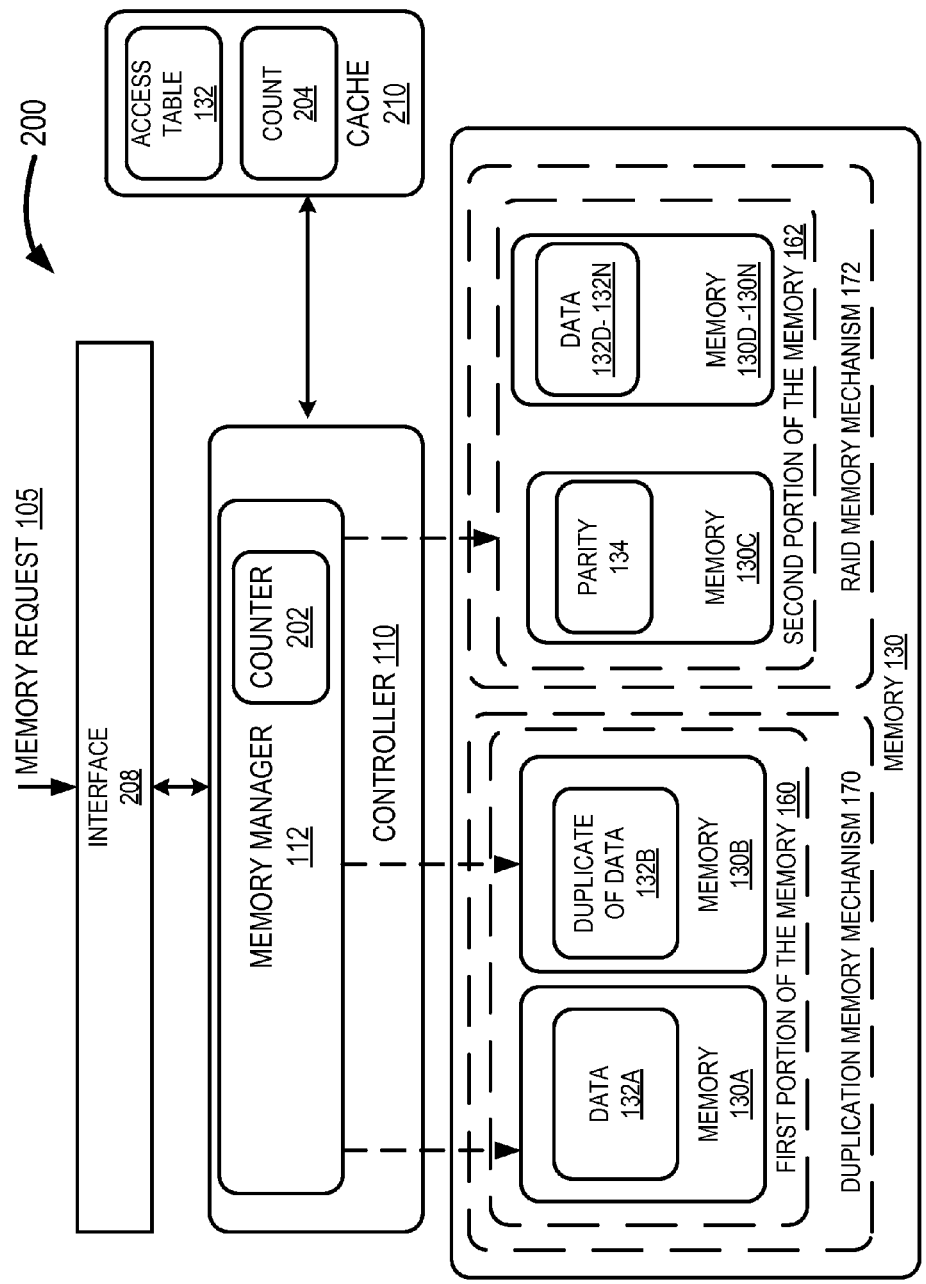
FIG. 2 is an illustration of memory system that may be operative to dynamically segment the memory into different portions and protect the different portions using a combination of different memory mechanisms.

FIG. 2 is an illustration of memory system 200 that may be operative to dynamically segment the memory 130 into different portions and protect the different portions using a combination of different memory mechanisms, in accordance with at least some embodiments. The memory system 200 may be similar to the memory system 100 illustrated in FIG. 1. As illustrated, the memory system 200 may include an interface 208, the controller 110, a cache 210, and the memory 130 that may include the memory 130A-130N. The controller 110 may include a memory manager 112 that may include a counter 202. The cache 210 may include a count 204 and the access table 132.

As illustrated, the controller 110 may be coupled to the interface 208, the cache 210 and the memory 130. In some examples, a memory bus, such as the memory bus 530 shown in FIG. 5, may couple the cache 210, the memory 130 and the controller 110. Generally, memory accesses, such as read and write accesses, with the memory 130 may be slower as compared to similar interactions with the cache 210.

Typically, a cache, such as the cache 210, may be embodied as a small, fast memory that may be used to store frequently used, recently used, or soon to be used, blocks of data for rapid access. In many examples, the size of the cache 210 may be smaller as compared to the size of the memories 130. The cache 210 may include volatile memory and/or non-volatile memory. In some configurations, the cache 210 may include volatile memory, such as random access memory (RAM). As illustrated, the cache 210 may include the access table 132 as discussed above, and the count 204.

In some configurations, the memory manager 112, the controller 110, or possibly some other component, may be configured to dynamically determine and/or change the size and/or location of the first portion of the memory 160 and the second portion of the memory 162. For example, the memory manager 112 may identify the most frequently written to memory locations. In some configurations, the memory manager 112 may use the counter 202 to maintain one or more counts (e.g., the count 204) that are associated with memory writes to the memory 130.

The memory manager 112, using the counter 202, may increment the count 204 each time a write is made to a memory page within the memory 130 and may decrement the count 204 each time a write is made to a different memory page within the memory 130. The memory pages that have the relatively highest counts at any time and/or within a certain time duration/range may be determined by the memory manager 112 as the most frequently accessed (e.g., write access). In other examples, the counter 202 may increment the count 204 each time a write is made to a memory page. In some configurations, the count 204 may be reset for one or more memory pages (e.g., hourly).

The count 204 may be used by the memory manager 112 when identifying the most frequently written to memory pages. Other mechanisms might also be used by the memory manager 112 to identify the most frequently written to memory pages. For example, data that is stored in the cache 210, or some other location, might be used to determine the frequently used, recently used, or soon to be used, blocks of data.

The memory manager 112 may segment the memory 130 using information derived from the count 204. In some examples, the memory 130 may be segmented into the first portion of the memory 160 and the second portion of the memory 162. According to some configurations, a specified percentage of the memory 130 that receives the most write accesses (e.g., as determined by the count 204 or some other mechanism) may be used by the memory manager 112 to determine what memory (e.g., lines or pages) to associate with each of the different portions. According to some examples, the percentage of the first portion of the memory 160 may be set to less than 20% of the total memory 130 and the remaining portion of the memory 130 may be associated with the second portion of the memory 162. Generally, the size of the first portion of the memory 160 may be set such that the majority (or otherwise relatively larger number) of the memory requests that are write requests (e.g., for some specified period) occur in the portion of the memory 130 that is located within the first portion of the memory 160.

In some configurations, a size of the first portion of the memory 160 and a size of the second portion of the memory 162 might be selected, based at least, in part, on a type of the memory 130 utilized. For instance, if the memory 130 utilizes a post-DRAM technology (e.g., phase change memories) where latency and energy overheads for memory accesses may be high, a larger size might be selected for the first portion of the memory 130. In this example, the RAID memory mechanism 172 that may be protecting the second portion of the memory may possibly involve three additional memory accesses per write access that may lead to significant performance and energy impact for a particular type of memory. In other examples, the size of the different portions might be selected based on the desired overall size of the memory and/or a desired reduction in the number of memory accesses. For example, increasing the first portion of the memory by 1% may increase the overall size of the memory 130 by 2% since the first portion of the memory 160 includes duplicate memory.

As discussed above, the first portion of the memory 160 and the second portion of the memory 162 may include memory pages that are spread throughout the memory 130. Stated another way, the memory that is associated with the first portion of the memory 160 does not need to be contiguous memory that starts before or after the memory that is associated with the second portion of the memory 162. For example, a portion of the memory pages for the memory 130A may be associated with the first portion of the memory 160 and a different portion of the memory pages for the memory 130A may be associated with the second portion of the memory 162.

According to some configurations, the memory manager 112 may dynamically change the memory pages that are associated with the first portion of the memory 160 and the memory pages that are associated with the second portion of the memory 162 at different times. For example, the memory manager 112 might segment the memory 130 periodically, according to a schedule, in response to an event, or using some other mechanism.

The memory manager 112 may also be configured to dynamically change the RAID scheme utilized for protection. For example, the memory manager 112 might initially use a RAID 5 scheme that utilizes block-level striping with dedicated parity to a RAID 6 scheme block-level striping with distributed parity. Other examples might include switching between any of the combinations of RAID 0-RAID 6. The memory manager 112 might change the RAID scheme in response to an event or some other condition.

Figure 3:
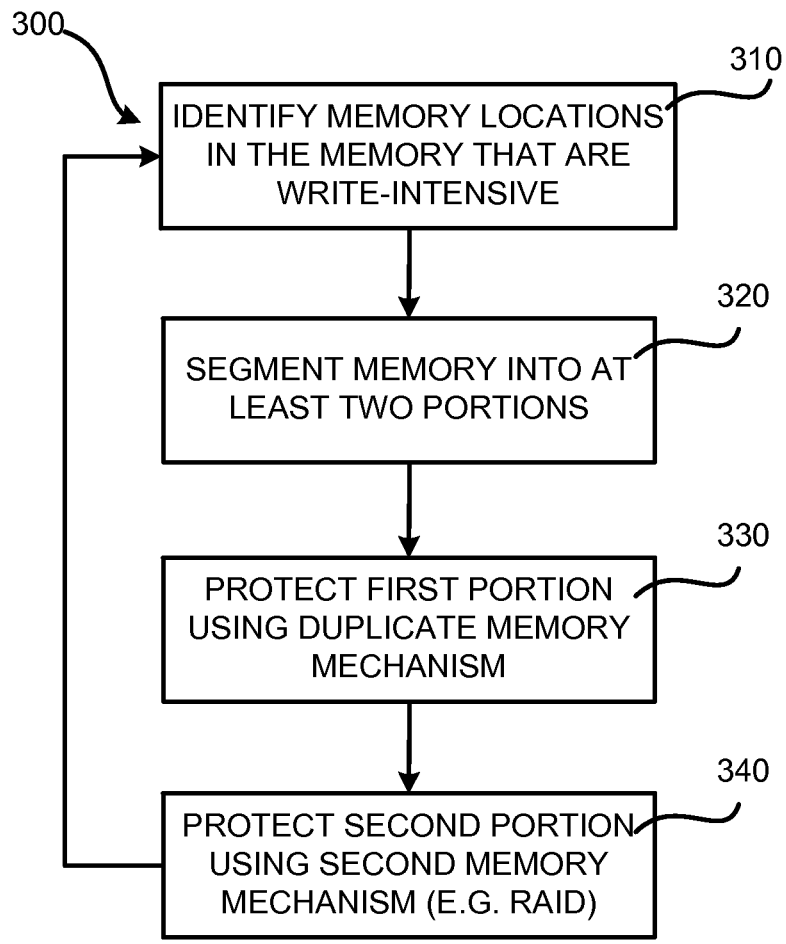
FIG. 3 is a flow diagram illustrating a method to protect memory using a combination of different memory mechanisms.
Figure 4:
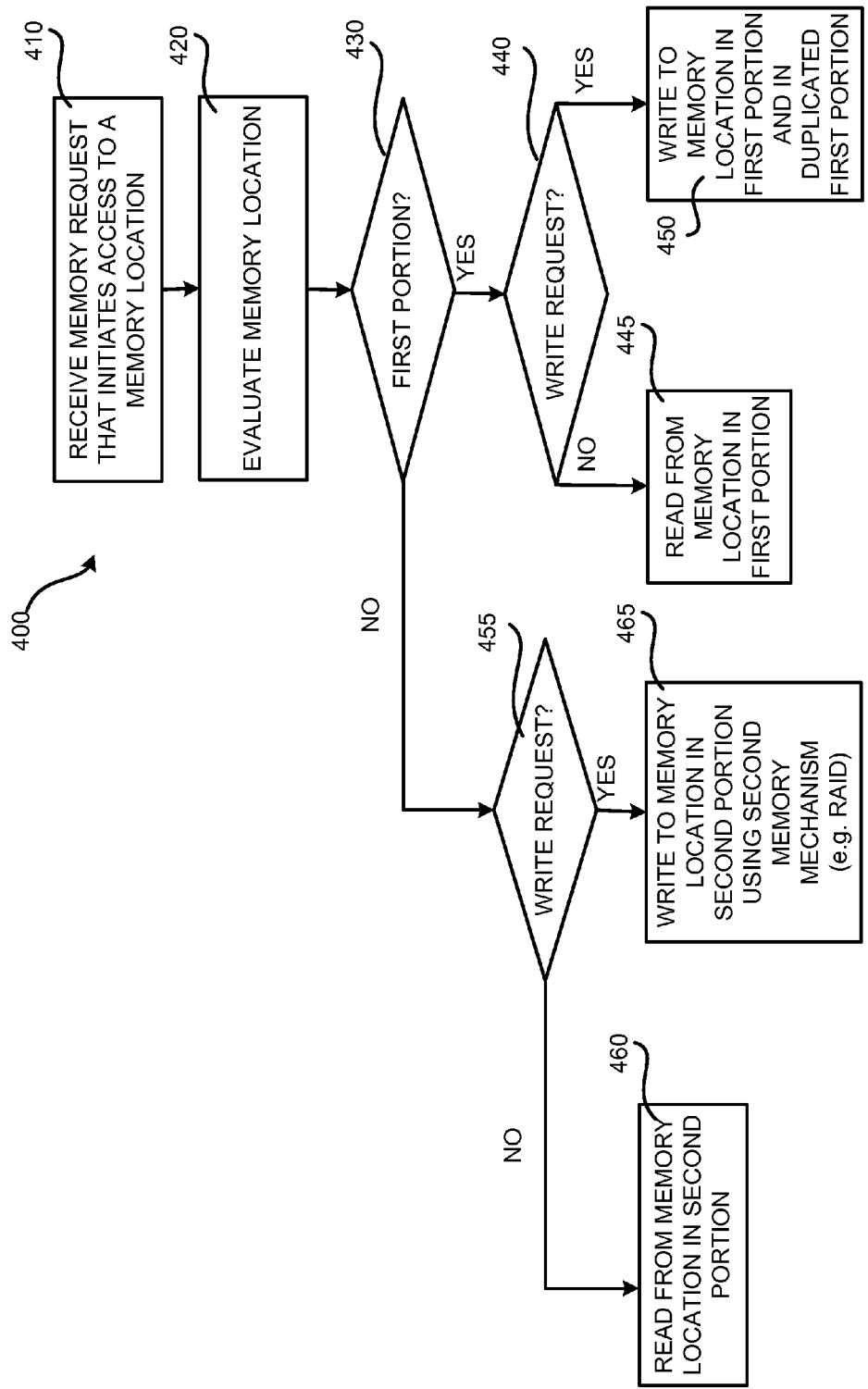
FIG. 4 is a flow diagram illustrating a method to determine which memory mechanisms to use when responding to a received memory request.

FIGS. 3-4 are flow diagrams respectively illustrating example processes/methods to reduce the overhead of memory accesses in a memory protection scheme, in accordance with at least some embodiments described herein. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated processes can be ended at any time and need not be performed in its entirety. Some or all operations of the processes, and/or substantially equivalent operations, can be performed by execution of computer-readable instructions included on a computer storage media, as defined herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like. For purposes of illustrating and describing the concepts of the present disclosure, the processes 300 and 400 are described as being performed, at least in part, by one or more components of the computing device 500 of FIG. 5. This embodiment is illustrative, and the processes may be performed in other ways using other device(s) or component(s) thereof.

FIG. 3 is a flow diagram illustrating a method to protect memory using a combination of different memory mechanisms, in accordance with at least some embodiments. A process 300 may begin at block 310 ("IDENTIFY MEMORY LOCATIONS IN THE MEMORY THAT ARE WRITE-INTENSIVE"), where the memory locations in the memory that are write-intensive may be identified. As discussed above, the memory manager 112, or some other component, may be used to identify the locations in the memory 130 that are written to more frequently as compared to other locations in the memory. In some examples, the memory manager 112 may maintain a count of write accesses to the memory locations in the memory 130.

The process 300 may continue to block 320 ("SEGMENT MEMORY INTO AT LEAST TWO PORTIONS"), where the memory 130 may be segmented into at least two portions. In some examples, the memory 130 is segmented into a first portion of the memory 160 and a second portion of the memory 162. As discussed above, the memory manager 112 may use a count of the writes to the different memory locations to determine what portion of the memory to segment into the first portion of the memory 160 and to segment into a second portion of the memory 162. In some examples, a specified percentage of the memory 130 that receives the most write accesses (e.g., as determined by the count or some other mechanism) may be used to determine what portion of the memory 130 to segment into the different portions.

The process 300 may continue to block 330 ("PROTECT FIRST PORTION USING DUPLICATE MEMORY MECHANISM"), where the first portion of the memory 160 may be protected using the duplicate memory mechanism 170. As discussed above, each memory location that is within the first portion of the memory 160 may be associated with a duplicate memory location that is located within a duplicate portion of the memory 130. In some configurations, the duplicate portion of the memory is stored in a different memory 130.

The process 300 may continue to block 340 ("PROTECT SECOND PORTION USING SECOND MEMORY MECHANISM (E.G. RAID)"), where the second portion of the memory 162 may be protected by a second memory mechanism. As discussed above, the second memory mechanism may be a RAID memory mechanism 172 (e.g., RAID 0, RAID 5). In some configurations, the process 300 may return to block 310.

FIG. 4 is a flow diagram illustrating a method to determine which memory mechanisms to use when responding to a received memory request, in accordance with at least some at least some embodiments described herein. The process 400 may begin at block 410 ("RECEIVE MEMORY REQUEST THAT INITIATES ACCESS TO A MEMORY LOCATION"), where a memory request 105 initiating access to a memory location in the memory 130 may be received. As discussed above, the memory request 105 may be received by the interface 208, the controller 110, or possibly some other component. In some configurations, the memory request 105 might be a read request to read from the memory 130 or a write request to write to the memory 130.

The process 400 may continue to block 420 ("EVALUATE MEMORY LOCATION"), where the memory location may be evaluated to determine whether the memory location is in the first portion of the memory 160 that may be associated with a first memory mechanism or is in a second portion of the memory 130 that may be associated with a second memory mechanism. As discussed above, in some examples, the memory manager 112 may access the access table 132 to determine whether the memory location is within the first portion or the second portion of the memory 130. Other mechanisms might also be used to determine whether the memory location is within the first portion of the memory 160 or within the second portion of the memory 162.

The process 400 may continue to decision block 430 ("FIRST PORTION?"), where a determination is made as to whether the memory location is in the first portion of the memory. In response to determining that the memory location is in the first portion of the memory, the process 400 may continue to decision block 440. In response to determining that the memory location is not in the first portion of the memory, the process 400 may continue to decision block 455.

At decision block 440 ("WRITE REQUEST?"), a determination is made by the memory manager 112 as to whether the memory request 105 is a write request. In response to determining that the memory request is a write request, the process 400 may flow to block 450. In response to determining that the memory request is a read request, the process 400 may flow to block 445.

At block 445 ("READ FROM MEMORY LOCATION IN FIRST PORTION"), the memory location in the first portion of the memory 160 may be read using the memory manager 112. At block 445 ("WRITE TO MEMORY LOCATION IN FIRST PORTION AND IN DUPLICATED FIRST PORTION"), the memory location in the first portion of the memory 160 is written to and a duplicate of the memory location is written to by the memory manager 112. As discussed above, the first portion of the memory 160 may be protected may the duplicate memory mechanism 170.

At decision block 455 ("WRITE REQUEST?"), a determination is made by the memory manager 112 as to whether the memory request 105 for the memory location that is within the second portion of the memory 162 is a write request or a read request. In response to determining that the memory request is a write request, the process 400 may flow to block 465. In response to determining that the memory request is a read request, the process 400 may flow to block 460.

At block 465 ("READ FROM MEMORY LOCATION IN SECOND PORTION"), the memory location in the second portion of the memory 162 may be read from using the memory manager 112. At block 465 ("WRITE TO MEMORY LOCATION IN SECOND PORTION USING SECOND MEMORY MECHANISM"), the memory location in the second portion of the memory 162 is written to according to a second memory mechanism. As discussed above, the second memory mechanism may be the RAID memory mechanism 172.

FIG. 5 is a block diagram illustrating an example computing device 500 that is arranged to implement technologies to reduce the overhead of memory accesses to memory protected by a fault-protection mechanism, arranged in accordance with at least some embodiments described herein. In a very basic configuration 501, computing device 500 typically includes one or more processors 510 and system memory 520. A memory bus 530 can be used for communicating between the processor 510 and the system memory 520.

Depending on the desired configuration, processor 510 can be of any type including, but not limited to, a microprocessor ("μP"), a microcontroller ("μC"), a digital signal processor ("DSP"), or any combination thereof. Processor 510 can include one or more levels of caching, such as a level one cache 511 and a level two cache 512, a processor core 513, and registers 514. The processor core 513 can include an arithmetic logic unit ("ALU"), a floating point unit ("FPU"), a digital signal processing core ("DSP core"), or any combination thereof. A memory controller 515 can also be used with the processor 510, or in some implementations, the memory controller 515 can be an internal part of the processor 510. The processor 510 can be a multi-core processor having two or more independent processing units ("cores"). In some embodiments, the processor 510, or the memory controller 515, may be used to implement the controller 110 having the memory manager 112 described above.

Depending on the desired configuration, the system memory 520 can be of any type including, but not limited to, volatile memory (such as RAM), non-volatile memory (such as ROM, flash memory, etc.) or any combination thereof. One or more components of the system memory 520 may be comprised of multilevel cells formed from GST material, providing a phase change memory. System memory 520 typically includes an operating system 521 and one or more applications 522. As illustrated, a first portion 160 of the system memory 520 may include a first portion of the memory that is protected by a first memory mechanism and a second portion 162 of the system memory 520 that is protected by a second memory mechanism. In some configurations, the previously described memory 130 may be implemented in the system memory 520.

Computing device 500 can have additional features or functionality, and additional interfaces to facilitate communications between the basic configuration 501 and any required devices and interfaces. For example, a bus/interface controller 540 can be used to facilitate communications between the basic configuration 501 and one or more data storage devices 550 via a storage interface bus 541. The data storage devices 550 can be removable storage devices 551, non-removable storage devices 552, or a combination thereof. In some embodiments, the data storage device 140 can be implemented by the one or more data storage devices 550. Examples of removable storage and non-removable storage devices include magnetic disk devices such as flexible disk drives and hard-disk drives ("HDD"s), optical disk drives such as compact disk ("CD") drives or digital versatile disk ("DVD") drives, solid state drives ("SSD"s), and tape drives to name a few. Example computer storage media can include volatile and nonvolatile, removable and non-removable media implemented in any method or technology for storage of information, such as computer readable instructions, data structures, program modules, or other data.

System memory 520, removable storage devices 551 and non-removable storage devices 552 are all examples of computer storage media. Computer storage media includes, but is not limited to, RAM, ROM, EEPROM, flash memory or other memory technology, CD-ROM, digital versatile disks ("DVD"s) or other optical storage, magnetic cassettes, magnetic tape, magnetic disk storage or other magnetic storage devices, or any other medium which can be used to store the desired information and which can be accessed by computing device 500. Any such computer storage media can be part of the computing device 500.

Computing device 500 can also include an interface bus 542 for facilitating communication from various interface devices (e.g., output interfaces, peripheral interfaces, and communication interfaces) to the basic configuration 501 via the bus/interface controller 540. Example output devices 560 include a graphics processing unit 561 and an audio processing unit 562, which can be configured to communicate to various external devices such as a display or speakers via one or more A/V ports 563. The example peripheral interfaces 570 include a serial interface controller 571 or a parallel interface controller 572, which can be configured to communicate with external devices such as input devices (e.g., keyboard, mouse, pen, voice input device, touch input device, etc.) or other peripheral devices (e.g., printer, scanner, etc.) via one or more I/O ports 573. An example communication device 580 includes a network controller 581, which can be arranged to facilitate communications with one or more other computing devices 590 over a network communication via one or more communication ports 582. The communication connection is one example of a communication media.

Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency ("RF"), infrared ("IR"), fiber optics, and other wireless media. The term computer readable media as used herein can include both storage media and communication media.

Computing device 500 can be implemented as a portion of a small-form factor portable (or "mobile") electronic device such as a cell phone, a personal data assistant ("PDA"), a personal media player device, a wireless web-watch device, a personal headset device, an application specific device, or a hybrid device that include any of the above functions. Computing device 500 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. This disclosure is not limited to particular methods, compounds, or compositions, which can, of course, vary. The terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general, such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitation unless specifically stated to require such serial or temporal order.

For any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to reduce write overhead to a memory in a fault protection scheme, the method comprising:
   receiving a memory request that initiates access to a memory location in the memory, wherein the memory includes a first portion and a second portion, the first portion duplicated to provide a duplicated first portion;
   evaluating the memory location to determine whether the memory location is located within the first portion or within the second portion;
   in response to determining that the memory location is located within the first portion:
      accessing the memory location located within the first portion, in response to the memory request being a read request, and
      accessing the memory location located within the first portion and a duplicate of the memory location that is located within the duplicated first portion, in response to the memory request being a write request;
   in response to determining that the memory location is located within the second portion:
      accessing the memory location located within the second portion, in response to the memory request being the read request, and
      accessing the memory location located within the second portion Using a redundant array of independent disks (RAID) memory mechanism, in response to the memory request being the write request;
   in response to the memory request being the write request, incrementing a count in a counter, wherein the count corresponds to a number of writes made to different portions of the memory;
   dynamically adjusting a size and a location of the first portion and the second portion of the memory, wherein the size of the first portion and the second portion of the memory is selected based, at least in part, on a type of the memory; and
   segmenting the memory according to the count such that a portion of the memory with a relatively higher count is associated with the first portion of the memory and a remaining portion of the memory with a relatively lower count is associated with the second portion of the memory.

2. The method of claim 1, wherein receiving the memory request that initiates access to the memory location in the memory includes receiving a memory request that initiates one or more of a read access or a write access to one or more memory locations.

3. The method of claim 1, further comprising identifying the first portion of the memory that is duplicated based, at least in part, on a number of writes made to different memory locations of the memory within a specified time period.

4. The method of claim 1, wherein evaluating the memory location to determine whether the memory location is located within the first portion comprises reading an access table that stores information that indicates which memory locations of the memory are duplicated.

5. The method of claim 1, further comprising dynamically changing the RAID memory mechanism between a first RAID memory mechanism and a second RAID memory mechanism.

6. The method of claim 1, wherein accessing the memory location using the RAID memory mechanism comprises computing a new parity and writing the new parity.

7. The method of claim 1, wherein the first portion of the memory that is duplicated is less than twenty percent of the memory.

8. The method of claim 1, wherein the second portion of the memory is protected by the RAID memory mechanism, which uses at least one of parity or block level striping.

9. The method of claim 1, wherein the memory has a higher latency and energy overhead as compared to a dynamic random access memory (DRAM).

10. An apparatus, comprising:
one or more memories that includes a first portion and a second portion, wherein the first portion of the one or more memories is duplicated to provide a duplicated first portion; and
a controller coupled to the one or more memories, wherein the controller is configured to:
receive a memory request that requests access to a memory location in the one or more memories;
determine that the memory location is located within the first portion;
in response to the determination that the memory location is located within the first portion:
read from at least one of the memory location located within the first portion or a corresponding memory location located in the duplicated first portion, in response to the memory request being a read request, and
write to the memory location located within the first portion and a location located within the duplicated first portion, in response to the memory request being a write request;
in response to the memory location being located outside of the first portion:
determine that the memory location is located within the second portion,
read from the memory location located within the second portion, in response to the memory request being the read request, and
write to the memory location located within the second portion, in response to the memory request being the write request;
in response to the memory request being the write request increment a count in a counter, wherein the count corresponds to a number of writes made to different portions of the one or more memories;
dynamically adjust a size and a location of the first portion and the second portion of the one or more memories, wherein the size of the first portion and the second portion of the one or more memories is selected based, at least in part, on a type of the one or more memories; and
segment the one or more memories according to the count such that a portion of the one or more memories with a relatively higher count is associated with the first portion of the one or more memories and a remaining portion of the one or more memories with as relatively lower count is associated with the second portion of the one or more memories.

11. The apparatus of claim 10, wherein to write to the memory location located within the second portion, the controller is configured to use a redundant array of independent disks (RAID) memory mechanism.

12. The apparatus of claim 10, wherein the counter includes a plurality of counts, and wherein each count is associated with a different memory location of the one or more memories, such that in response memory request being the write request, a count associated with the memory location of the write request is incremented and counts associated with the other memory locations of the one more memories are decremented.

13. The apparatus of claim 10, wherein the controller is further configured to dynamically change a location of the first portion within the one or more memories.

14. The apparatus of claim 10, wherein to write to the memory location located within the second portion, the controller is configured to compute a new parity and to write the new parity.

15. The apparatus of claim 10, wherein at least a portion of the one or more memories has a higher latency and energy overhead as compared to a dynamic random access memory (DRAM).

16. The apparatus of claim 10, further comprising a redundant array of independent disks (RAID) memory mechanism configured to use block-level striping with distributed parity to protect the second portion of the one or more memories.

17. A non-transitory computer-readable medium that includes computer-executable instructions stored thereon which, in response to execution by a computer, cause the computer to
determine whether a memory request is a write request to write to at least one of: a first portion of one or more memories that is protected by a duplicate memory mechanism or a second portion of the one or more memories that is protected by a second memory mechanism;
in response to the write request to write to the first portion, write data to the first portion of the one or more memories and write the data to another memory based, at least in part, on the duplicate memory mechanism;
in response to the write request to write to the second portion, perform the write to the second portion based, at least in part, on the second memory mechanism;
in response to the memory request being the write request, increment a count in a counter, wherein the count corresponds to a number of writes made to different portions of the one or more memories;
dynamically adjust a size and a location of the first portion and the second portion of the one or more memories, wherein the size of the first portion and the second portion of the one or more memories is selected based, at least in part, on a type of the one or more memories; and
segment the memory according to the count such that a portion of the one or more memories with a relatively higher count is associated with the first portion of the one or more memories and a remaining portion of the one or more memories with a relatively lower count is associated with the second portion of the one or more memories.

18. The non-transitory computer-readable medium of claim 17, further comprising computer-executable instructions stored thereon which, in response to execution by the computer, cause the computer to;
determine whether the memory request is a read request to read from at least one of: the first portion or the second portion;
in response to the read request to read from the first portion, read from the first portion; and in response to the read request to read from the second portion, read from the second portion based, at least in part, on the second memory mechanism.

19. The non-transitory computer-readable medium of claim 17, wherein the second memory mechanism comprises a redundant array of independent disks (RAID) memory mechanism that includes block-level striping and distributed parity.

20. The non-transitory computer-readable medium of claim 17, wherein a location of the first portion is changed based, at least in part, on memory accesses to the one or more memories.

* * * * *

UNITED STATES PATENT AND TRADEMARK OFFICE
CERTIFICATE OF CORRECTION

| | | |
|---|---|---|
| PATENT NO. | : 9,747,035 B2 | Page 1 of 1 |
| APPLICATION NO. | : 14/573259 | |
| DATED | : August 29, 2017 | |
| INVENTOR(S) | : Kumar et al. | |

It is certified that error appears in the above-identified patent and that said Letters Patent is hereby corrected as shown below:

In the Claims

In Column 16, Line 31, in Claim 1, delete "Using" and insert -- using --, therefor.

In Column 17, Line 9, in Claim 8, delete "block level" and insert -- block-level --, therefor.

In Column 17, Line 46, in Claim 10, delete "request increment" and insert -- request, increment --, therefor.

In Column 17, Line 60, in Claim 10, delete "as" and insert -- a --, therefor.

In Column 18, Line 2, in Claim 12, delete "response memory" and insert -- response to the memory --, therefor.

In Column 18, Line 5, in Claim 12, delete "one more" and insert -- one or more --, therefor.

In Column 18, Line 27, in Claim 17, delete "computer to" and insert -- computer to: --, therefor.

Signed and Sealed this
Twenty-fourth Day of April, 2018

Andrei Iancu
*Director of the United States Patent and Trademark Office*